March 8, 1966 I. S. SHAW 3,239,776
AMPLITUDE REGULATED OSCILLATOR CIRCUIT
Filed Sept. 10, 1963
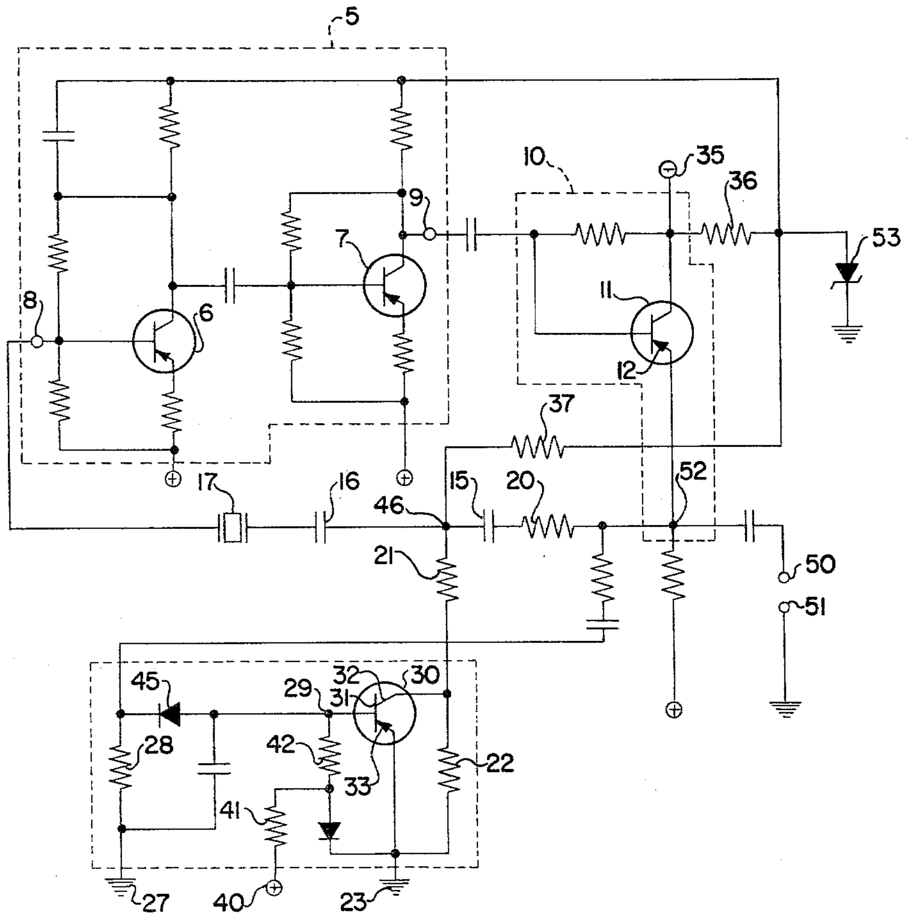
INVENTOR
IAN S. SHAW
BY Louis A. Kline
Richard G. Stahr
HIS ATTORNEYS United States Patent Office 3,239,776
Patented Mar. 8, 1966

3,239,776

AMPLITUDE REGULATED OSCILLATOR CIRCUIT

Ian S. Shaw, Dayton, Ohio, assignor to The National Cash Register Company, Dayton, Ohio, a corporation of Maryland Filed Sept. 10, 1963, Ser. No. 308,008
3 Claims. (Cl. 331—109)

The present invention relates to oscillator circuits and, more specifically, to regulated oscillator circuits.

A common oscillator in general use employs a conventional amplifier circuit in which sustained oscillations are attained by returning a portion of the output signal of the amplifier through a feedback loop to its input in such a phase sense that the returned signal tends to increase the amplitude of the amplifier output signal. To select the frequency at which oscillators of this type oscillate, a frequency-determining element, which may be a filter, a tuned circuit, or a quartz crystal, is inserted in the feedback loop. To initiate oscillation in a circuit of this type, it is mandatory that the loop gain be greater than unity, and, to sustain oscillations, it is necessary that the circuit be non-linear.

Generally, the amplifier portion of this circuit serves as a non-linear element; however, when the amplifier circuitry saturates, the output signal is severely clipped. Therefore, the fundamental harmonic must be isolated by means of an additional resonant circuit or filter arrangement.

However, the use of inductors for the purpose of retrieving the fundamental frequency is unsatisfactory because of their size, expense, and "figure of merit," or "Q." Furthermore, the clipping level of a saturated amplifier may vary with temperature and supply potential magnitudes, thereby reducing the reliability of circuits of this type.

As it is desirable that the output voltage amplitude be predictable and selectable, the output level should be substantially independent of the feedback circuit impedance and supply potential variations, within design ranges.

To stabilize oscillations in circuits of this type, a non-linear device is necessary, as the oscillations, which are initiated as a consequence of the positive feedback in a circuit having a loop gain greater than one, increase rapidly in amplitude until limited by the non-linear device. Since a saturated amplifier is unsatisfactory as this non-linear device because of the required Class A operation for a reliable distortion-free oscillator, another solution must be found.

It is, therefore, an object of this invention to provide an improved oscillator circuit of this type.

It is another object of this invention to provide an improved oscillator circuit of this type having a shunt variable attenuating circuit included in the feedback circuit which serves as the required non-linear device.

It is a further object of this invention to provide an improved oscillator circuit of this type in which the non-linear variable attenuating circuit, connected in shunt with the feedback circuit, regulates the oscillator output signal amplitude in response to the magnitude of the feedback signal.

In accordance with this invention, a frequency-selecting element is included in the feedback electrical circuit connected between the output circuit and the input circuit of a conventional amplifier, and a variable, non-linear attenuating circuit is connected in shunt with the feedback circuit for regulating the amplitude of the amplifier output signal by varying the impedance thereof in response to the amplitude of the feedback signal.

For a better understanding of the present invention, together with additional objects, advantages, and features thereof, reference is made to the following description and accompanying drawing.

Illustrated within the dashed rectangle 5 of the drawing is a conventional two-stage linear amplifier including the transistors 6 and 7, each having the usual base, emitter, and collector electrodes, and an input circuit terminal 8 and an output circuit terminal 9.

As is well known in the art, an amplifier of this type may be converted to an oscillator by returning a portion of the output signal from the output circuit terminal 9 through a frequency-selecting device to the input circuit terminal 8 in such a phase sense that the feedback signal tends to increase the amplitude of the amplifier output signal. Although the feedback signal amplitude follows and is proportional to the output signal amplitude, for any given value of output signal amplitude, the amount of positive feedback depends upon the series impedance of the feedback circuitry and the frequency-determining device. If this impedance is too high, the loop gain may be insufficient to initiate oscillation, and, if this impedance is too low, the amplifier may saturate.

To insure that the oscillations are initiated and that the amplifier does not saturate, it is necessary that the amplifier device be maintained in Class A operation and that the impedance of the positive feedback circuitry be altered in response to the magnitude of the output signal level. Since the magnitude of the output signal may be controlled by the magnitude of the feedback signal, the feedback signal may be employed as the reference upon which output signal magnitude is determined.

In the preferred embodiment, a conventional emitter-follower circuit, indicated within the dashed lines 10, is capacitor-coupled to the output circuit terminal 9 of the amplifier 5 for the purpose of reducing the output impedance, so that the oscillator may drive greater loads, and includes a transistor 11, having the usual base, emitter, and collector electrodes. It is to be specifically understood, however, that this circuit is not mandatory for the operation of this invention but has been shown to indicate the flexibility of this novel concept.

With this embodiment, therefore, the positive feedback signal is taken from the emitter 12 of the transistor 11 at the point 52 and is returned to the input circuit terminal 8 of the amplifier 5 through a feedback circuit which includes a resistor 20, capacitors 15 and 16, and a frequency-determining device 17, which, in this instance, has been indicated to be a quartz crystal. It is to be specifically understood, however, that other frequency-determining devices may be included in this circuit, and the use of a quartz crystal is not to be construed as a limitation to this novel concept. Therefore, it is apparent that a portion of the output signal of the amplifier 5, which appears at the output circuit terminal 9, is returned as a feedback signal to the input circuit terminal 8 thereof through the feedback circuit just described, by way of the emitter follower circuit 10. In this embodiment, the magnitude of the feedback signal returned to the input terminal 8 is varied to control the magnitude of the output signal generated by the amplifier 5.

To introduce a non-linear characteristic into the feedback circuitry to stabilize oscillations, there is provided a variable attenuating circuit arrangement including series resistors 21 and 22, which are connected in shunt with the feedback circuit previously described between the point 46 and a point of reference potential 23. As the series resistors 21 and 22 are connected in shunt with the feedback circuit, a portion of the feedback signal current is shunted therethrough to the point of reference potential 23. Should the impedance value of the resistors 21 and 22 be lowered, more feedback signal current will be conducted therethrough to the point of reference potential 23, thereby reducing the magnitude of the feedback signal, and, should the impedance value of these resistors be raised, less feedback signal current will be conducted therethrough to the point of reference potential 23, thereby increasing the magnitude of the feedback signal. The magnitude of feedback signal, therefore, may be varied as the impedance of the resistors 21 and 22 is varied. The magnitude of the feedback signal, therefore, may be regulated inversely as feedback signal magnitude changes, by varying the impedance of the resistors 21 and 22 inversely as the magnitude of the feedback signal changes in response to changes in feedback signal magnitude.

The impedance of the shunt resistors 21 and 22 may be varied electronically in response to changes of feedback signal magnitude by varying the direct current bias, as determined by feedback signal magnitude, upon the base or control electrode 31 of the regulating transistor 30, the collector electrode 32 and the emitter electrode 33 of which are connected in shunt with the resistor 22, as indicated.

The collector electrode 32 of the transistor 30 is connected to a source of negative potential 35 through resistors 36, 37, and 21, while the base electrode 31 is connected to a point 29 along a voltage divider network comprising the series combination of resistors 41 and 42, diode 45, and resistor 28 connected between a source of positive potential 40 and the point of reference potential 27. A Zener diode 53 is connected between a point of reference potential, shown in the drawing as ground, and a point at the junction of the resistors 36 and 37. With this arrangement, the base electrode 31 of the transistor 30 is at a potential more positive than that of the emitter electrode 33, connected to the point of reference potential 23, at the time when the circuit commences operation, a condition which does not satisfy the base-emitter bias requirements of conduction through a type PNP transistor; therefore, the transistor 30 is normally not conducting. With the transistor 30 not conducting, the impedance of the shunt resistors of the attenuation arrangement is of a maximum value. This is necessary so that the amplitude of the signal appearing in the output circuit terminal 9 of the amplifier 5, returned to its input circuit terminal 8, will be maximum to initiate oscillations. As the amplitude of the amplifier output signal increases, the magnitude of that portion returned to the input terminal 8 as the feedback signal also increases. A portion of the feedback signal is applied through the diode 45 to the base or control electrode 31 of the regulating transistor 30. Its negative excursions are rectified by the diode 45 and applied as a negative potential direct current bias to the base 31 of the transistor 30, a condition which satisfies the base-emitter bias requirements for conduction through a type PNP transistor; therefore, the transistor 30 begins to conduct. As the transistor 30 begins to conduct, the effective impedance of the resistor 22 of the attenuating circuit is reduced, since feedback signal current is being conducted to the point of reference potential 23 through the conducting transistor 30. This has the effect of reducing the effective impedance of the variable attenuating circuit arrangement and, therefore, the magnitude of the feedback signal appearing at the point 46, since a greater portion of this signal is being shunted to the point of reference potential 23. As the amplitude of the output signal appearing at the output circuit terminal 9 of the amplifier 5 increases in magnitude, the resulting increased negative excursions of the feedback signal are rectified by the diode 45 and impressed upon the base electrode 31 of the regulating transistor 30, thereby increasing its forward bias. The resulting increased current flow therethrough, in shunt with the resistor 22, further reduces the effective impedance of the variable attenauting circuit arrangement and, of course, further decreases the magnitude of the feedback signal appearing at the point 46, thereby tending to reduce the magnitude of the output signal appearing at the output circuit terminal 9 of the amplifier 5. In this manner, therefore, the impedance of this variable attenuating circuit may be varied in response to changes in magnitude of the feedback signal.

As the magnitude of the amplifier output signal is proportional to the amplitude of the feedback signal, the output signal produced by the amplifier 5 may thus be regulated and stabilized in response to changes in feedback signal magnitude.

The signals produced by the oscillator of this invention may be impressed upon external utilization circuitry, not shown, through the output circuit terminals 50 and 51.

In the preferred embodiment, the emitter follower circuit 10 was inserted for the purpose of reducing the output impedance of the amplifier 5, as previously stated. It is to be specifically understood, however, that this circuit may be dispensed with completely by connecting the point 52 through a capacitor to the output circuit terminal 9 of the amplifier 5 without departing from the spirit of this invention or altering the operation of the regulating feature. Similarly, changes in the amplifier circuitry and the attenuating circuitry and control may be made without departing from the spirit of the invention.

While a preferred embodiment of the present invention has been shown and described, it will be obvious to those skilled in the art that various modifications and substitutions may be made without departing from the spirit of the invention, which is to be limited only within the scope of the appended claims.

What is claimed is:

1. A regulated oscillator circuit comprising an amplifier device having an input circuit means and an output circuit means for producing an output signal, a feedback electrical circuit means connected between said output circuit means and said input circuit means for returning a portion of said output signal as a feedback signal to said input circuit means in such a phase sense that said feedback signal tends to increase the amplitude of said output signal thereby producing oscillations in said amplifier device, a frequency selecting element in said feedback electrical circuit means for determining the frequency of said oscillations, a variable attenuating circuit means connected in shunt with said feedback circuit means whereby the magnitude of said feedback signal may be regulated by varying the impedance thereof for regulating said output signal magnitude, means responsive to the magnitude of said feedback signal connected in shunt with at least a portion of said variable attenuating circuit means for varying the impedance of said variable attenuating circuit means, and system output circuit means for connecting said regulated oscillator circuit to external utilization circuit means.

2. A regulated oscillator circuit comprising an amplifier device having an input circuit means and an output circuit means for producing an output signal, a feedback electrical circuit means connected between said output circuit means and said input circuit means for returning a portion of said output signal as a feedback signal to said input circuit means in such a phase sense that said feedback signal tends to increase the amplitude of said output signal thereby producing oscillations in said amplifier device, a frequency selecting element in said feedback electrical circuit means for determining the frequency of said oscillations, a variable attenuating circuit means connected in shunt with said feedback circuit means whereby the magnitude of said feedback signal may be regulated by varying the impedance thereof for regulating said output signal magnitude, a regulating transistor device having a control electrode, an emitter electrode, and a collector electrode, means for connecting said emitter and collector electrodes in shunt with at least a portion of said attenuating circuit means, means for applying a portion of said feedback signal to said control electrode in such a polarity sense as to produce conduction through said regulating transistor whereby the impedance of said variable attenuating circuit means is varied in response to the magnitude of said feedback signal, and system output circuit means for connecting said regulated oscillator circuit to external utilization circuit means.

3. A regulated oscillator circuit comprising an amplifier device having an input circuit means and an output circuit means for producing an output signal, an emitter follower circuit connected to said output circuit means, a feedback electrical circuit means connected between said emitter follower circuit and said input circuit means of said amplifier device for returning a portion of said output signal as a feedback signal to said input circuit means in such a phase sense that said feedback signal tends to increase the amplitude of said output signal, thereby producing oscillations in said amplifier device, a frequency selecting element in said feedback electrical circuit means for determining the frequency of said oscillations, a variable attenuating circuit means connected in shunt with said feedback circuit means whereby the magnitude of said feedback signal may be regulated by varying the impedance thereof for regulating said output signal magnitude, a regulating transistor device having a control electrode, an emitter electrode, and a collector electrode, means for connecting said emitter and collector electrodes in shunt with at least a portion of said attenuating circuit means, means for applying a portion of said feedback signal to said control electrode in such a polarity sense as to produce conduction through said regulating transistor whereby the impedance of said variable attenuating circuit means is varied in response to the magnitude of said feedback signal, and system output circuit means for connecting said regulated oscillator circuit to external utilization circuit means.

References Cited by the Examiner

UNITED STATES PATENTS

| | | | |
|---|---|---|---|
| 2,663,800 | 12/1953 | Herzog | 332—29 X |
| 2,912,654 | 11/1959 | Hansen | 331—117 |

OTHER REFERENCES

Article in Electronic Engineering, August 1959, page 468.

ROY LAKE, *Primary Examiner.*

JOHN KOMINSKI, *Examiner.*